(12) United States Patent
Wang et al.

(10) Patent No.: US 8,977,926 B2
(45) Date of Patent: Mar. 10, 2015

(54) MODIFIED TARGETED SYMBOL FLIPPING FOR NON-BINARY LDPC CODES

(71) Applicant: LSI Corporation, Milpitas, CA (US)

(72) Inventors: Chung-Li Wang, San Jose, CA (US); Lei Chen, Sunnyvale, CA (US); Fan Zhang, Milpitas, CA (US); Shaohua Yang, San Jose, CA (US); Qi Qi, Livermore, CA (US)

(73) Assignee: LSI Corporation, San Jose, CA (US)

( * ) Notice: Subject to any disclaimer, the term of this patent is extended or adjusted under 35 U.S.C. 154(b) by 202 days.

(21) Appl. No.: 13/629,726

(22) Filed: Sep. 28, 2012

(65) Prior Publication Data

US 2014/0095954 A1    Apr. 3, 2014

(51) Int. Cl.
*H03M 13/00* (2006.01)
*G06F 11/00* (2006.01)
*H03M 13/11* (2006.01)
*H03M 13/37* (2006.01)

(52) U.S. Cl.
CPC ...... *H03M 13/1108* (2013.01); *H03M 13/3738* (2013.01)
USPC .......................................... 714/753; 714/799

(58) Field of Classification Search
CPC ..................... H03M 13/1105; H03M 13/1128; H03M 13/1108; H03M 13/3738; G06F 11/1004

USPC .................. 714/746, 755, 786, 800, 753, 799
See application file for complete search history.

(56) References Cited

U.S. PATENT DOCUMENTS

| 8,219,873 | B1 * | 7/2012 | Ng et al. ........................ 714/752 |
| 8,607,118 | B2 * | 12/2013 | No et al. ........................ 714/755 |
| 2005/0193320 | A1 | 9/2005 | Varnica et al. |
| 2010/0042897 | A1 | 2/2010 | Han et al. |
| 2010/0174959 | A1 | 7/2010 | No et al. |
| 2011/0231731 | A1 | 9/2011 | Gross et al. |

OTHER PUBLICATIONS

Nguyen et al., Selecting two-bit bit flipping algorithms for collective error correction, Jun. 2012, IEEE, pp. 2881 to 2885.*
Kiran et al., Girth of the Tanner graph and error correction capability of LDPC codes, Sep. 2008, IEEE, pp. 1238-1245.*

* cited by examiner

*Primary Examiner* — Shelly A Chase
(74) *Attorney, Agent, or Firm* — Suiter Swantz pc llo

(57) ABSTRACT

A LDPC decoder includes a processor for targeted symbol flipping of suspicious bits in a LDPC codeword with unsatisfied checks. All combinations of check indices and variable indices are compiled and correlated into a pool of targeted symbol flipping candidates and returned along with symbol indices to a process that uses such symbol indices to identify symbols to flip in order to break a trapping set.

14 Claims, 2 Drawing Sheets

MODIFIED TARGETED SYMBOL FLIPPING FOR NON-BINARY LDPC CODES

FIELD OF THE INVENTION

The present invention is directed generally toward low-density parity-check (LDPC) codes and more particularly toward an efficient LDPC symbol flipping architecture.

BACKGROUND OF THE INVENTION

In most real signal transmission applications there can be several sources of noise and distortions between the source of the signal and its receiver. As a result, there is a strong need to correct mistakes in the received signal. As a solution for this task one should use some coding technique with adding some additional information (i.e., additional bits to the source signal) to ensure correcting errors in the output distorted signal and decoding it. One type of coding technique utilizes low-density parity-check (LDPC) codes. LDPC codes are used because of their fast decoding (linearly depending on code-word length) property.

LDPC decoders correct errors by unsatisfied checks. When the number of unsatisfied check is low, decoders tends to keep the errors and fall into "trapping sets," or stable configurations that may not be resolved by further decoding iterations. One mechanism for addressing this problem is targeted symbol flipping.

Targeted symbol flipping is the process of changing one or more variable bits associated with an unsatisfied check so that further decoding is possible. Targeted symbol flipping has long latency and complicated mode switching because memory elements send a request to get symbol addresses before each trial. Besides long runtimes, the hardware has a complicated state machine that is difficult to verify. Targeted symbol flipping as it exists currently has too many modes and suffers from long latency.

Consequently, it would be advantageous if an apparatus existed that is suitable for simplified targeted symbol flipping.

SUMMARY OF THE INVENTION

Accordingly, the present invention is directed to a novel method and apparatus for simplified targeted symbol flipping.

On embodiment of the present invention is a method for simplified targeted symbol flipping wherein a combination LE queue and hard decision memory (LEH) receives and stores all symbol addresses before run mode. The method may include finding suspicious checks to give more decoding trials.

Another embodiment of the present invention is an apparatus for simplified targeted symbol flipping. The apparatus may include a processor configured to receive and store all symbol addresses before run mode. The processor may also be configured to find suspicious checks to give more decoding trials.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
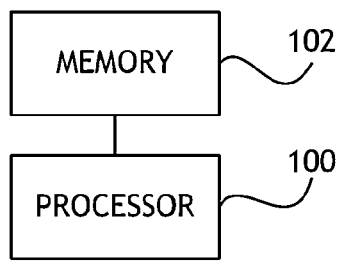
FIG. 1 shows a block diagram of a computer system useful for implementing embodiments of the present invention.

Referring to FIG. 1, a block diagram of a computing device useful for implementing embodiments of the present invention is shown. The computing device may include a processor 100 connected to a memory 102. The processor 100 may be configured to execute computer executable program code to implement methods according to embodiments of the present invention. The memory 102 may be configured to store computer executable program code to implement methods according to embodiments of the present invention and to store output of embodiments of the present invention in appropriate data structures.

Figure 2:
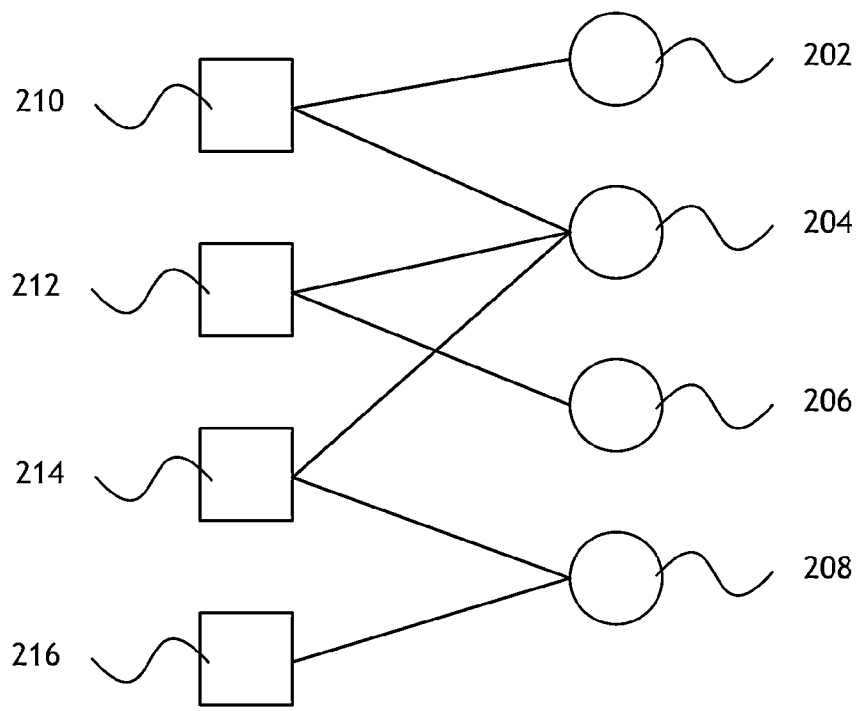
FIG. 2 shows a tanner graph of a LDPC code.

Referring to FIG. 2, a tanner graph of a LDPC code is shown. A tanner graph related to a LDPC code is a graphic representation of the corresponding parity-check matrix. The columns of that matrix may be represented by variable nodes 202, 204, 206, 208 and the rows (check equations) may be represented by check nodes 210, 212, 214, 216. The tanner graph in FIG. 2 shows a LDPC code wherein a first check node 210 represents an equation corresponding to the parity-check matrix having the following non-zero variables: a first variable node 202 and a second variable node 204; a second check node 212 represents an equation having the following non-zero variables: the second variable node 204 and the third variable node 206; a third check node 214 represents an equation having the following non-zero variables: the second variable node 204 and a fourth variable node 218; and a fourth check node 216 represents an equation having the following non-zero variables: the fourth variable node 208. One skilled in the art may appreciate that a tanner graph may be a representation of a LDPC code parity-check matrix, where check nodes correspond to rows, variable nodes correspond to columns, and check node and variable node are connected if a nonzero value stays in the intersection of the corresponding row and column.

There are two potential error conditions based on signal noise in LDPC decoding. In the first error condition, the signal received by the decoder does not correspond to a valid codeword; in that case the decoder may be able to recover the signal based on an algorithm using parity information contained in the signal, or the signal may be unrecoverable if the distortion is severe enough. The second error condition, herein called miscorrection, involves a distorted signal that is decoded to a valid but incorrect codeword, in which case the decoder may falsely believe that the signal has been properly decoded. Miscorrection may result when a valid codeword is distorted by noise in a particular way such that the distorted signal becomes closer to another (incorrect) valid code word, different from the correct one. The conditions that may produce miscorrection are specific to the particular LDPC code;

furthermore, the probability of miscorrection may be associated with the nature and extent of signal noise, and the statistical distribution of various codewords.

Signal noise may include AWGN, partial response (PR), jitter, or other effects due to noisy transmission channels.

Figure 3:
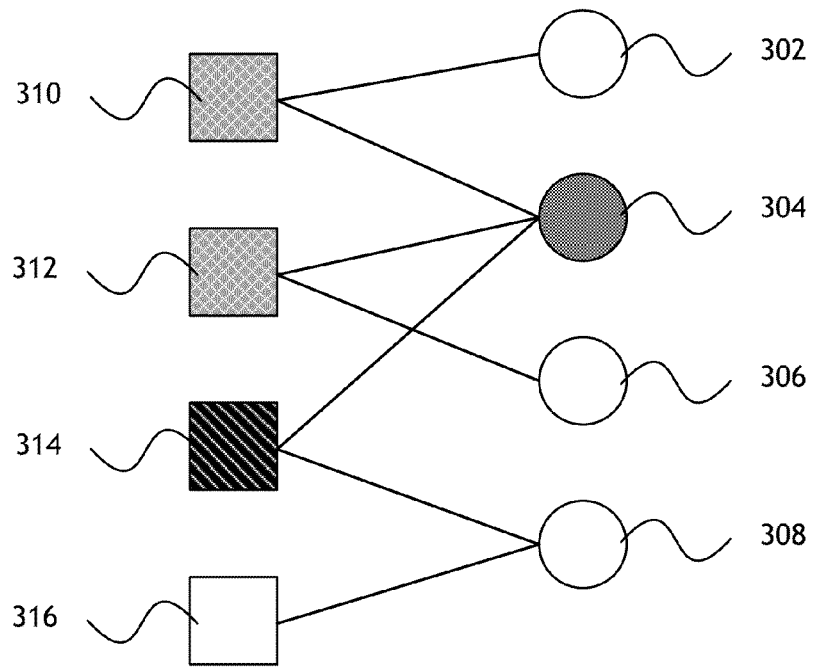
FIG. 3 shows a tanner graph of a LDPC code with unsatisfied and suspicious check nodes.

Referring to FIG. 3, a tanner graph of a LDPC code with unsatisfied and suspicious check nodes is shown. When an LDPC codeword is transmitted through a noisy channel, one or more bits may be corrupted. A tanner graph may have an unsatisfied check node 314. The unsatisfied check node 314 is a bit that does not correspond to the expected result of an equation based on variable nodes 304, 308 connected to the unsatisfied check node 314. For example, where the equation is an exclusive disjunction operation, a processor may perform an exclusive disjunction operation on a second variable node 304 and a fourth variable node 308. Each variable node 304, 308 may contain a bit of information; where each of the second variable node 304 and fourth variable node 308 contain a bit corresponding to a "1," the corresponding third check node 314 would be expected to contain a bit corresponding to a "0." If the third check node 314 contains a bit corresponding to a "1" then the third check node 314 is "unsatisfied."

Where a check node 310, 312, 314, 316 is unsatisfied, one of the corresponding variable nodes 302, 304, 306, 308 must be corrupted, or some combination of check nodes 310, 312, 314, 316 must be corrupted.

Figure 4:
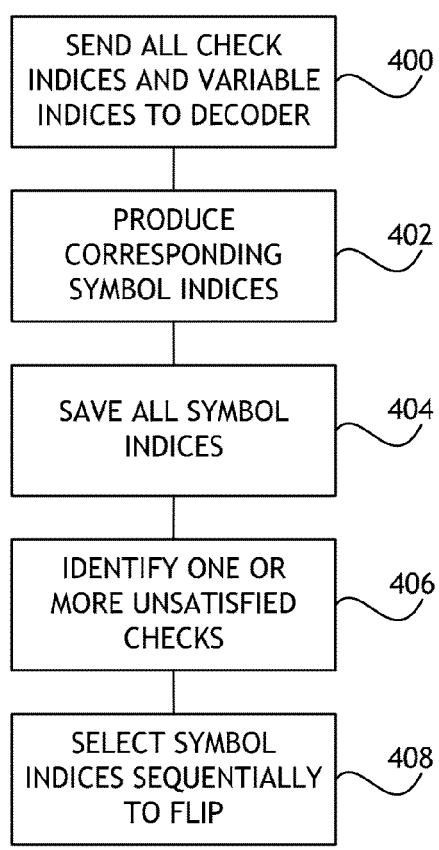
FIG. 4 shows a flowchart of a method for targeted bit flipping in LDPC decoding.

Referring to FIG. 4, a flowchart of a method for targeted bit flipping in LDPC decoding is shown. The method may include sending 400 all check indices and variable indices to a decoder. The decoder may then produce 402 corresponding symbol indices and save 404 all of those symbol indices in a pool of symbols for targeted symbol flipping.

Where an encoded signal includes unsatisfied checks, a decoder may identify 406 one or more unsatisfied checks. The decoder may attempt to resolve the unsatisfied check through iterative error correction processes known in the art. If the decoder is unable to resolve an unsatisfied check through means known in the art, the decoder may use targeted symbol flipping to produce a word that may be resolved through iterative processes.

A decoder may select 408 symbol indices to flip so as to identify the corrupted variable. The decoder may identify the index of each unsatisfied check through means known in the art. A decoder may then identify variable nodes connected to the unsatisfied check. Variable nodes connected to the unsatisfied check may be designated as suspicious, or certain variable nodes from such group of variable nodes may be designated suspicious based on a confidence level associated with each variable node.

For each suspicious variable node, connected check nodes may be either unsatisfied or suspicious. The decoder may utilize unsatisfied or suspicious check nodes to determine candidate variable nodes for targeted symbol flipping. The decoder may then pick a symbol from the pool of candidate variable nodes, flip the symbol and perform an iteration. Alternatively, the decoder may pick two symbols from the pool of candidate variable nodes, flip both symbols and perform two iterations. When the decoder selects two symbols, the two symbols cannot be the same and cannot be connected to the same check.

A single suspicious variable node may be connected to one or more check nodes besides the unsatisfied check node. Such additional check nodes may be identified as suspicious check nodes if they are satisfied. When the number of unsatisfied checks is one, the decoder may identify the unsatisfied check node as a suspicious check node. A decoder may process $MIN_1$ and $MIN_{idx}$ data for the unsatisfied check node.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of determining targeted symbol flipping candidates comprising:
    receiving two or more check indices and two or more variable indices;
    producing two or more symbol indices corresponding to the two or more variable indices;
    saving all symbol indices in a pool of symbol indices;
    identifying at least one unsatisfied check;
    identifying two or more variable nodes associated with the at least one unsatisfied check; and
    classifying the two or more variable nodes associated with the at least one unsatisfied check as suspicious variable nodes.

2. The method of claim 1, further comprising:
    identifying a suspicious variable node associated with the at least one unsatisfied check;
    processing $MIN_1$ and $MIN_{idx}$ data associated with the at least one unsatisfied check;
    identifying two or more check nodes associated with the suspicious variable;
    classifying the two or more checks as suspicious checks; and
    generating symbol indices based on the suspicious checks.

3. The method of claim 2, wherein the suspicious variable node is identified on the basis of a confidence value.

4. The method of claim 1, wherein saving all symbol indices comprises saving symbol indices associated with distinct check indices to distinct data structures.

5. The method of claim 4, wherein the data structure is a table row.

6. An apparatus for determining targeted symbol flipping candidates comprising:
    a processor;
    memory connected to the processor; and
    computer executable program code configured to execute on the processor,
    wherein the computer executable program code is configured to:
        receive two or more check indices and two or more variable indices;
        produce two or more symbol indices corresponding to the two or more variable indices;
        save all symbol indices in a pool of symbol indices;
        identify at least one unsatisfied check;
        identify two or more variable nodes associated with the at least one unsatisfied check; and
        classify the two or more variable nodes associated with the at Least one unsatisfied check as suspicious variable nodes.

7. The apparatus of claim 6, wherein the computer executable program code is further configured to:
    identify a suspicious variable node associated with the at Least one unsatisfied check;
    process $MIN_1$ and $MIN_{idx}$ data associated with the at least one unsatisfied check;

identify two or more check nodes associated with the suspicious variable;

classify the two or more checks as suspicious checks; and generate symbol indices based on the suspicious checks.

8. The apparatus of claim 7, wherein the suspicious variable node is identified on the basis of a confidence value.

9. The apparatus of claim 6, wherein the computer executable program code is further configured to save all symbol indices by saving symbol indices associated with distinct check indices to distinct data structures.

10. The apparatus of claim 9, wherein the data structure is a table row.

11. An apparatus for determining targeted symbol flipping candidates comprising:

a LEH unit;

a DEC unit connected to the LEH unit; and a computer executable program code;

wherein the computer executable program code is configured to:

the LEH unit is configured to send all combinations of check indices and variable indices to the DEC unit;

the DEC unit is configured to receive two or more check indices and two or more variable indices;

the DEC unit is configured to produce two or more symbol indices corresponding to the two or more variable indices and send such symbol indices to the LEH unit;

the LEH unit is configured to receive and save all symbol indices in a pool of symbol indices;

the DEC unit is configured to identify at least one unsatisfied check;

the DEC unit is configured to identify two or more variable nodes associated with the at least one unsatisfied check; and the DEC unit is configured to classify the two or more variable nodes associated with the at Least one unsatisfied check as suspicious variable nodes.

12. The apparatus of claim 11, wherein the DEC unit is further configured to:

identify a suspicious variable node associated with the at least one unsatisfied check;

process $MIN_1$ and $MIN_{idx}$ data associated with the at Least one unsatisfied check;

identify two or more check nodes associated with the suspicious variable;

classify the two or more checks as suspicious checks; and generate symbol indices based on the suspicious checks.

13. The apparatus of claim 12, wherein the suspicious variable node is identified on the basis of a confidence value.

14. The apparatus of claim 11, wherein the DEC unit is further configured to save all symbol indices by saving symbol indices associated with distinct check indices to distinct data structures.

* * * * *